US006263479B1

(12) United States Patent
Tajima

(10) Patent No.: US 6,263,479 B1
(45) **Date of Patent: *Jul. 17, 2001**

(54) METHOD AND APPARATUS FOR LAYOUT OF AN INTERFACE OF DIGITAL AND ANALOG SEMICONDUCTOR INTEGRATED CIRCUITS BASED ON POSITIONS OF DIGITAL AND ANALOG FUNCTIONAL BLOCKS

(75) Inventor: Hisayuki Tajima, Kanagawa (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/995,992

(22) Filed: Dec. 22, 1997

(30) Foreign Application Priority Data

Dec. 25, 1996 (JP) ........................................ 8-345046

(51) Int. Cl.[7] ........................................ G06F 17/50
(52) U.S. Cl. ........................................ 716/11; 716/9
(58) Field of Search ........................ 395/500.12, 500.09, 395/500.03, 500.08, 500.1, 500.11, 500.13; 716/2, 7, 8, 10, 11, 12

(56) References Cited

U.S. PATENT DOCUMENTS 5,416,722 * 5/1995 Edwards .................................. 716/2
5,515,293 * 5/1996 Edwards .................................. 716/211
5,604,680 * 2/1997 Bamji et al. .............................. 716/8
5,610,832 * 3/1997 Wikle et al. .............................. 716/211

FOREIGN PATENT DOCUMENTS 6-268064 9/1994 (JP) .

* cited by examiner

*Primary Examiner*—Matthew Smith
*Assistant Examiner*—Vuthe Siek
(74) *Attorney, Agent, or Firm*—Foley & Lardner

(57) ABSTRACT

There is provided a method of positioning a semiconductor integrated circuit device including a plurality of blocks, on a semiconductor substrate, including the steps of separating data about connection of a semiconductor integrated circuit into a plurality of functional blocks, establishing a connection point to each of the functional blocks, establishing an interface pad macro at the connection point for each of the functional blocks, and connecting the functional blocks to each other, setting instance names of the interface pad macros to be identical with instance names of the functional blocks, positioning the functional blocks and thereby the interface pad macros, extracting data about positioning of the interface pad macros, inputting the thus extracted data to the functional blocks to thereby position the interface pad macros, and combining the functional blocks with each other. The above-mentioned method makes it possible to arrange and position LSI having different design rules, such as LSI including analog and digital circuits formed on a common substrate.

5 Claims, 8 Drawing Sheets

METHOD AND APPARATUS FOR LAYOUT OF AN INTERFACE OF DIGITAL AND ANALOG SEMICONDUCTOR INTEGRATED CIRCUITS BASED ON POSITIONS OF DIGITAL AND ANALOG FUNCTIONAL BLOCKS

BACKGROUND OF THE INVENTION

1. Field of the Invention

The invention relates to a method of positioning a semiconductor integrated circuit onto a semiconductor substrate, and also to an apparatus of carrying out the method. The invention relates more particularly to a method of positioning a semiconductor integrated circuit device including both analog and digital circuits therein, and also to an apparatus of carrying out the method.

2. Description of the Related Art

When a semiconductor integrated circuit including analog and digital circuits therein is arranged on a semiconductor substrate, structure and layout for analog and digital circuits are separately designed, because individual semiconductor integrated circuit devices have different device characteristics and uses. A semiconductor integrated circuit device is designed under hierarchy design, and the analog and digital circuits are connected to each other in top hierarchy. That is, a design of an interface between them is accomplished at top hierarchy. Conventional steps of designing a semiconductor integrated circuit device including analog and digital circuits are explained hereinbelow with reference to FIGS. 1 and 2A to 2C.

With reference to FIG. 1, analog and digital circuits and are designed in step 51. Then, interfaces for the analog and digital circuits designed in step 51 are designed at top hierarchy in step 52. Then, in step 53, a layout 61 (see FIG. 2A) of the analog circuit is designed based on connection data of the analog circuit, and a layout 62 (see FIG. 2A) of the digital circuit is also designed based on connection data of the digital data. Data about the thus designed layouts 61 and 62 of the analog and digital circuits are stored in layout data storing regions 55 and 51, respectively. Then, in step 54, hard macros 63 and 64, illustrated in FIG. 2B, for the analog and digital circuits are designed based on data of the layouts 61 and 62 of the analog and digital circuits. The thus designed hard macros 63 and 64 of the analog and digital circuits are stored in a region 56 in step 55. Finally, in step 56, interfaces for the analog and digital circuits are designed based on both connection data of top hierarchy 65 having been designed in step 52 and the hard macros 63, 64 of the analog and digital circuits having been stored in the layout-designing device 56 in step 55. The thus designed interfaces of the analog and digital circuits are stored in a layout-storing region 57.

By carrying out the above-mentioned steps. it is possible to design a semiconductor integrated circuit including different design rules. However, it is necessary to establish the hard macros 63 and 64 for the analog and digital circuits, and hence the interfaces are designed for the analog and digital circuits at the top hierarchy. Thus, it is necessary to have the layout region 65 for the interfaces, as illustrated in FIG. 2C, and it is further necessary to examine the connection between the analog and digital circuits to assure the connection therebetween.

For example, Japanese Unexamined Patent Publication No. 6-268064 has suggested a method of designing a layout of a semiconductor integrated circuit device. FIG. 3 illustrates the flowchart of this method, which is almost the same as the flowchart illustrated in FIG. 1, but is different only in that there is formed a region 77 for storing a hard macro model, and the thus stored hard macro model is used for designing hard macros of analog and digital circuits in step 54.

Specifically, hard macro models 87 and 88 for the analog and digital circuits are in advance formed in order to make it easy to establish hard macros for the analog and digital circuits, as illustrated in FIG. 4A. After analog and digital circuits 81 and 82 (see FIG. 4A) have been positioned, data about positioning of interface terminals is replaced with data 83 and 84 about positioning of terminals of the hard macro models 87 and 88, thereby the hard macros for the analog and digital circuits are established. In addition, even in the above-mentioned method, it is necessary to prepare a layout region 85 for interfaces, and it is also necessary to make examination on the connection between the analog and digital circuits 81 and 82 to assure the connection therebetween.

The above-mentioned method has problems as follows. The first one is that when LSI including analog and digital circuits, which employs Bi-CMOS process, is to be fabricated, it would take much time to examine a connection between the analog and digital circuits for assurance thereof. The reason is as follows. Since the analog and digital circuits in LSI employing Bi-CMOS process have different device characteristics and uses, they have different design rules, and hence, structure and layout of them are separately designed. Hence, it is necessary to make examination on connection between the analog and digital circuits.

The second problem is difficulty in applying a computer-aided design (CAD) tool to the method. The reason is as follows. Since the analog and digital circuits have different device characteristics and uses, different design rules are applied to them. Hence, it is unavoidable that conditions for applying CAD tool to the method become complicated.

The third problem is that it is difficult to increase an area occupied by a chip of LSI including analog and digital circuits. The reason is as follows. Even in accordance with the above-mentioned method suggested in Japanese Unexamined Patent Publication No. 6-268064, it is possible to establish hard macros for analog and digital circuits, and design wiring layout. However, it is necessary to secure an area for wirings to be used only for connecting the analog and digital circuits to each other, which decreases an area for LSI chip.

SUMMARY OF THE INVENTION

In view of the foregoing problems of the conventional method, it is an object of the present invention to provide a method of positioning a semiconductor integrated circuit device on a semiconductor substrate, which makes it easier to arrange and position LSI having different design rules, such as LSI including analog and digital circuits formed on a common substrate. It is also an object of the present invention to provide an apparatus for carrying out the above-mentioned method.

In one aspect of the present invention, there is provided a method of positioning a semiconductor integrated circuit device comprising a plurality of blocks, on a semiconductor substrate, including the steps of (a) separating data about connection of a semiconductor integrated circuit into a plurality of functional blocks, (b) establishing a connection point to each of the functional blocks, (c) establishing an interface pad macro at the connection point for each of the functional blocks, and connecting the functional blocks to each other, (d) setting instance names of the interface pad macros to be identical with instance names of the functional blocks, (e) positioning the functional blocks and thereby the interface pad macros, (f) extracting data about positioning of the interface pad macros, (g) inputting the thus extracted data to the functional blocks to thereby position the interface pad macros, and (h) combining the functional blocks with each other.

For instance, the functional blocks include at least analog and digital blocks. It is preferable that the step (a) further includes a step of separating the interface pad macros in each of the functional blocks into individuals in accordance with macro-naming rule. It is also preferable that the step (c) further includes a step of establishing interface pad macros having a common instance name in separated nets.

The above-mentioned method may further include the step of, after positioning a first interface pad macro of a certain functional block, using positional coordinate of the first interface pad macro as data about positioning of a second interface pad macro of other functional block which second interface pad macro has the same instance name as that of the certain functional block.

The above-mentioned method may further include the steps of establishing positional coordinates of the interface pad macros in accordance with uses thereof, and carrying out coordinate transformation on the positional coordinates for each of the uses.

There is further provided a method of positioning a semiconductor integrated circuit device including analog and digital circuits, on a semiconductor substrate, including the steps of (a) designing a layout of the analog circuit, (b) transforming first data designed in the step (a) about positioning of an interface to be connected to the digital circuit into second data about positioning of the digital circuit, (c) designing a layout of the digital circuit based on the second data, and (d) combining the layouts of the analog and digital circuits with each other to connect interfaces of the analog and digital circuits to each other.

For instance, the first data may include a name of the interface and positional coordinate of the interface.

In another aspect of the present invention, there is provided an apparatus for positioning a semiconductor integrated circuit device including analog and digital circuits, on a semiconductor substrate, including (a) a first device for designing the analog circuit, (b) a second device for designing the digital circuit, (c) a third device for designing a top hierarchy circuit, (d) a fourth device for separating and combining data about connection among the first, second and third devices, (e) a fifth device for designing a layout of the analog circuit, based on data transmitted from the fourth device, (f) a sixth device for designing a layout of the digital circuit, based on data transmitted from the fourth device, (g) a seventh device for extracting analog data from the fifth device, and transforming the analog data to digital data, and (h) an eighth device for combining data about the layouts of the analog and digital circuits to each other.

It is preferable that the fourth device separates the data into connection data of the analog and digital circuits in accordance with macro-naming rule. It is also preferable that the fourth device establishes interface pad macros at connection points of the analog and digital circuits when the data is separated, and provides the same instance name to the interface pad macros.

The advantages obtained by the aforementioned present invention will be described hereinbelow.

The first advantage is that TAT for new product development can be shortened, and design quality can be enhanced. This is because analog and digital circuits can be designed in accordance with their own design rules, and hence it is possible to design one-chip IC device without designing a layout of an interface between analog and digital circuits.

The second advantage is that a chip can be reduced in an area, and more highly integrated. Analog and digital circuits are confined to their layouts. After designing layouts for the analog and digital circuits, those layouts are combined to thereby define a layout of one-chip semiconductor IC device. That is, the reason why a chip can be reduced in an area and more highly integrated is that it is not necessary to secure an area for wirings which would connect the analog and digital circuits to each other.

In addition, since the analog and digital circuits are connected to each other without making a wiring for doing so, it is no longer necessary to examine connection between them at an interface. Hence, it is possible to design a qualified semiconductor IC device in shortened TAT with no errors in connection between the analog and digital circuits through an interface.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENT

Figure 1:
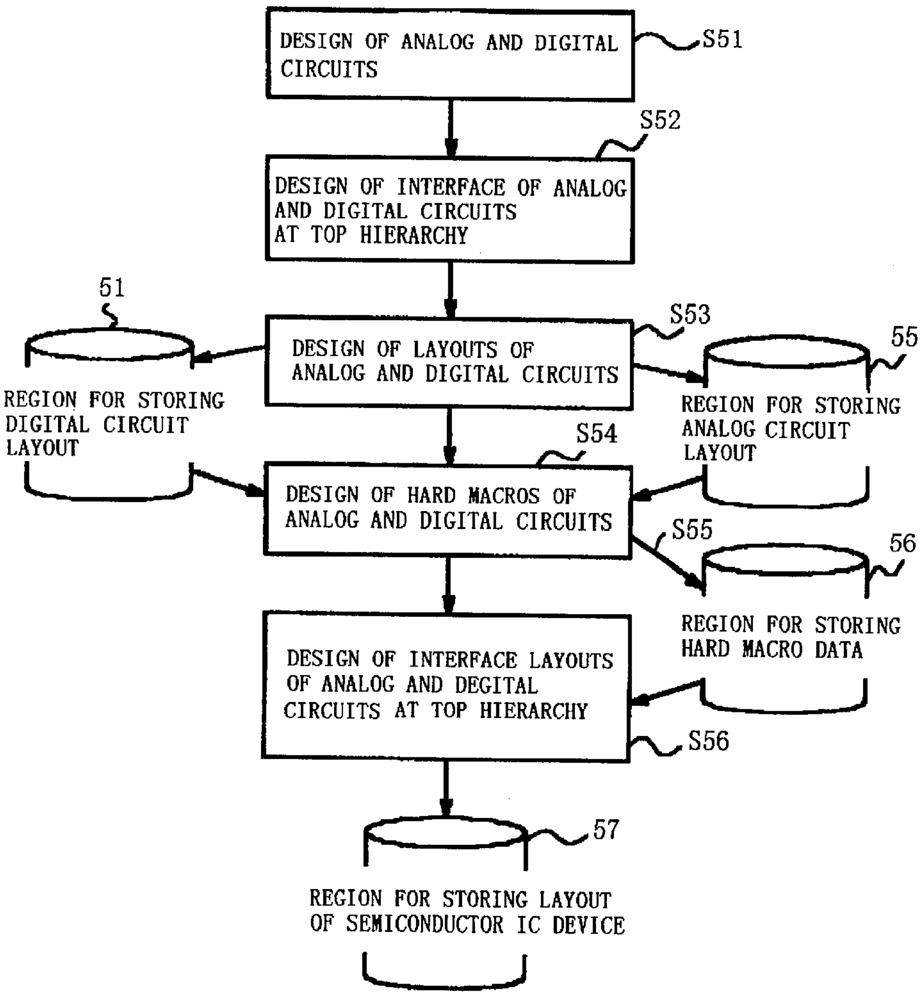
FIG. 1 is a flow chart of a conventional method of positioning a semiconductor integrated circuit device.
Figure 2A:
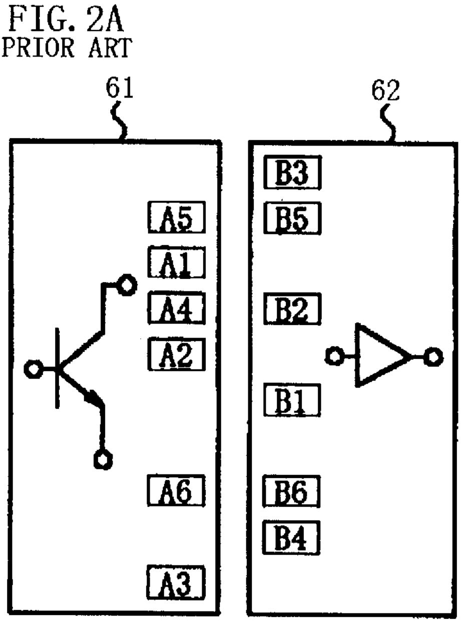
FIGS. 2A to 2C are top plan views showing positioning of the semiconductor integrated circuit device illustrated in FIG. 1.
Figure 2B:
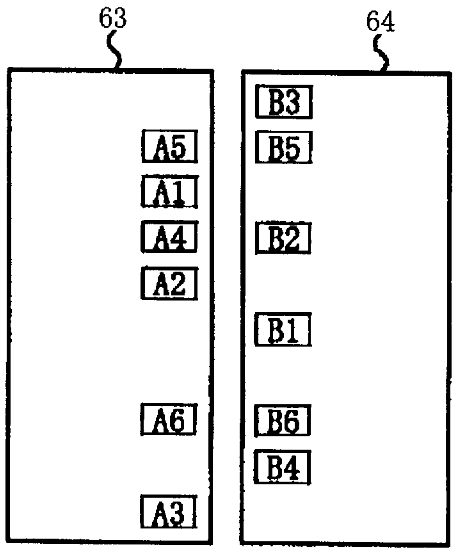
Figure 2C:
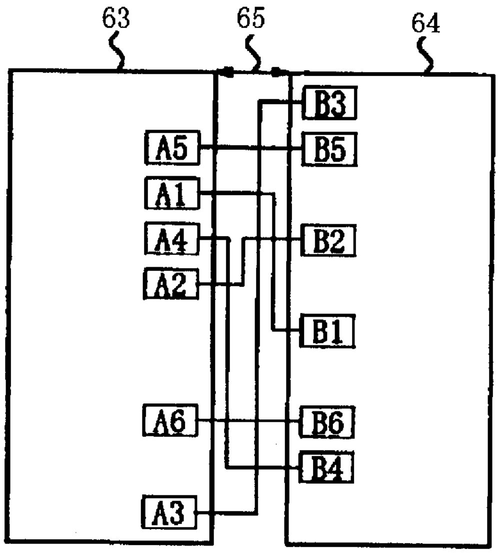
Figure 3:
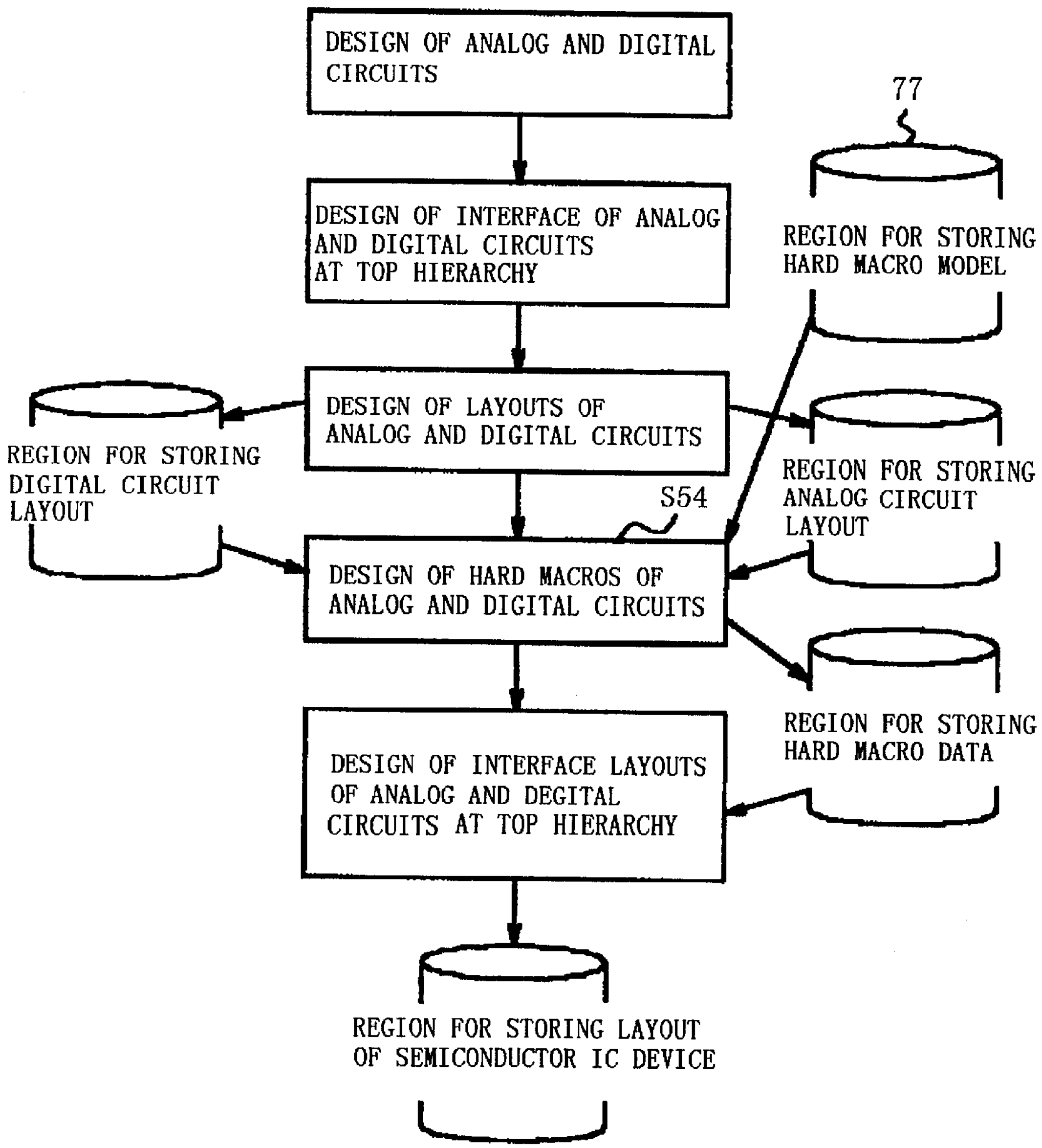
FIG. 3 is a flow chart of another conventional method of positioning a semiconductor integrated circuit device.
Figure 4A:
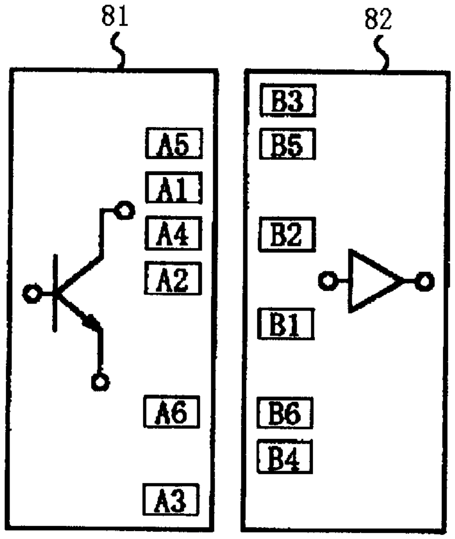
FIGS. 4A to 4D are top plan views showing positioning of the semiconductor integrated circuit device illustrated in FIG. 3.
Figure 4B:
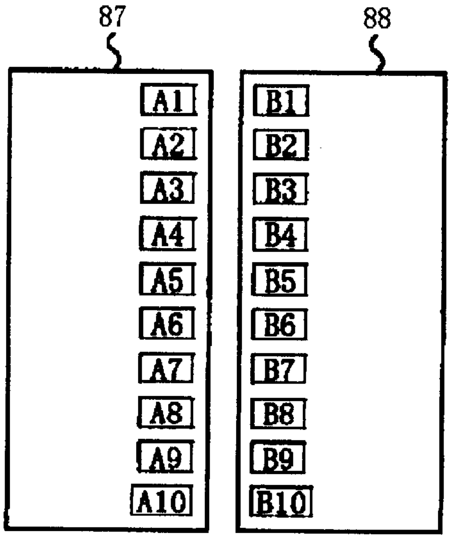
Figure 4C:
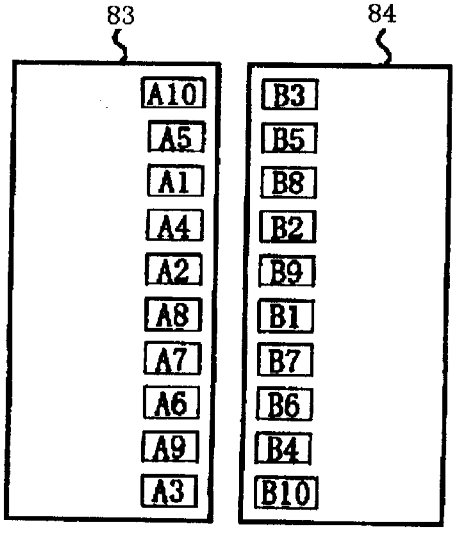
Figure 4D:
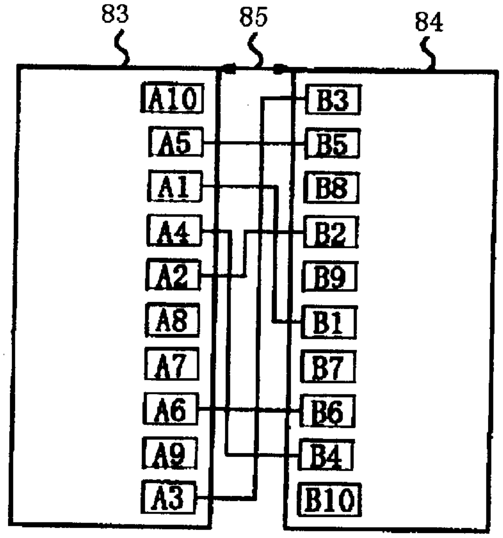
Figure 5:
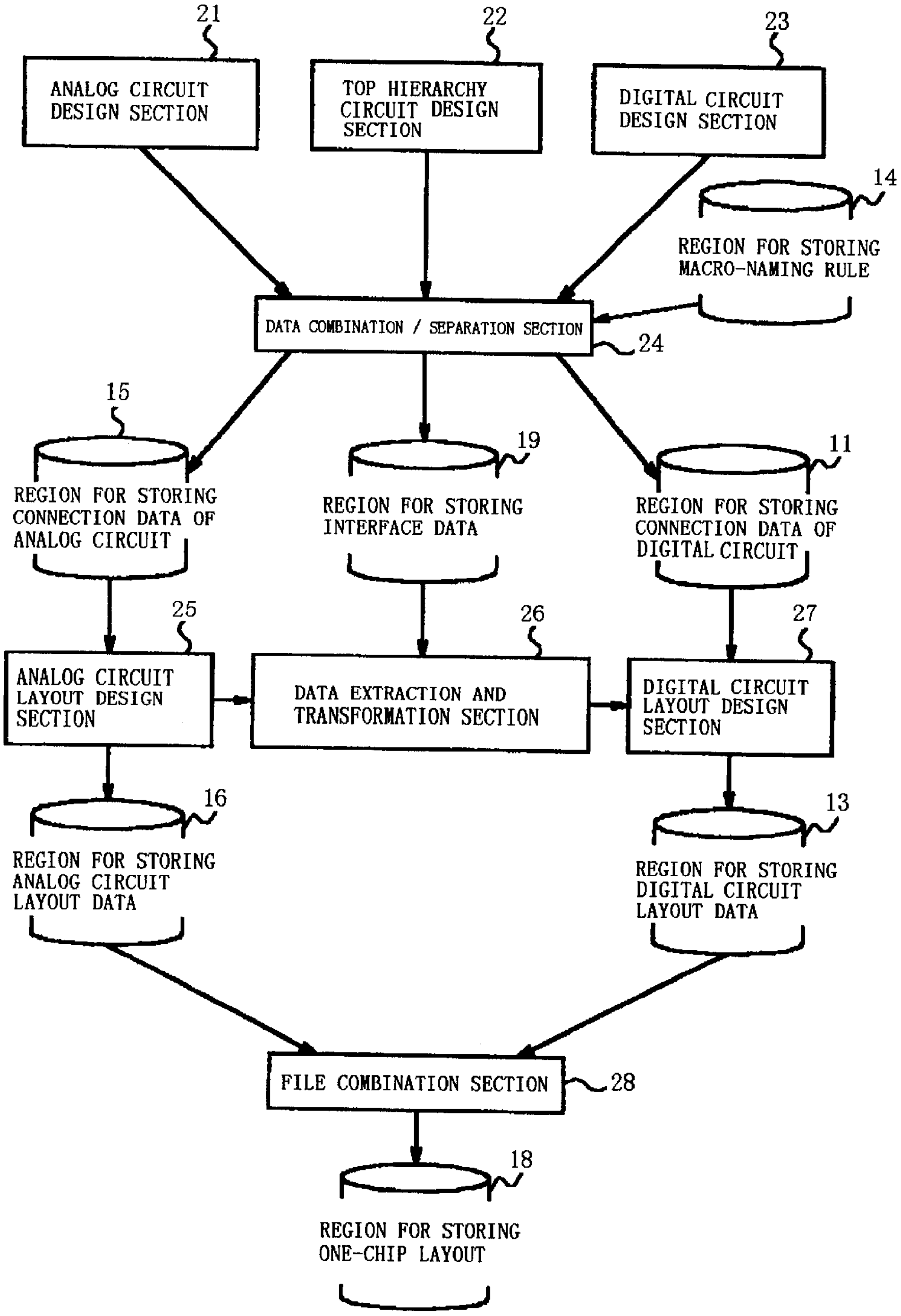
FIG. 5 is a block diagram of an apparatus for carrying out a method in accordance with the embodiment of the present invention.

A method in accordance with a preferred embodiment of the invention is explained hereinbelow with reference to FIGS. 5 and 6. FIG. 5 is a block diagram an apparatus for carrying out the method.

The illustrated apparatus for positioning a semiconductor integrated circuit device including analog and digital circuits, on a semiconductor substrate, includes a section 21 for designing an analog circuit, a section 23 for designing a digital circuit, and a section 22 for designing a top hierarchy circuit. A section 24 combines or separates connection data transmitted from the sections 21, 22 and 23. The apparatus further includes a section 25 for designing a layout of the analog circuit, based on data transmitted from the section 24, and a section 27 for designing a layout of the digital circuit, based on data transmitted from the section 24. A section 26 extracts analog data from the section 25, and transforms the thus extracted analog data into digital data; and further transmits the thus transformed digital data to the section 27. A section 28 receives data about the layouts of the analog and digital circuits from the sections 25 and 27, and combines the data about the layouts to each other.

A region 14 stores macro-naming rule therein, and provides the macro-naming rule to the section 24. The connection data about the digital circuit, processed in the section 24, is stored in a region 11, and is transmitted to the section 27. Similarly, the connection data about the analog circuit, processed in the section 24, is stored in a region 15, and is transmitted to the section 25. Data about an interface, processed in the section 24, is stored in a region 19, and is transmitted to the section 26.

Data about the layout of the digital circuit, designed in the section 27 is stored in a region 13, and data about the layout of the analog circuit, designed in the section 25 is stored in a region 16. Those data is transmitted to the section 28, where those data is combined. Data about one-chip layout, established in the section 28, is stored in a region 18.

The section 24 combines data about connection among the circuits designed in the sections 21, 22 and 23, and separates the thus combined data into connection data of the analog circuit and the digital circuit in accordance with the macro-naming rule stored in the region 14. On separation of the data, the section 24 establishes interface macro pads at connection points of the analog and digital circuits separated from each other, and provides the interface macro pads with the same instance name. The thus separated data about the analog and digital circuits are stored in the regions 15 and 11, respectively, and are employed for designing the layouts of the analog and digital circuits in the section 25 and 27, respectively.

Figure 6:
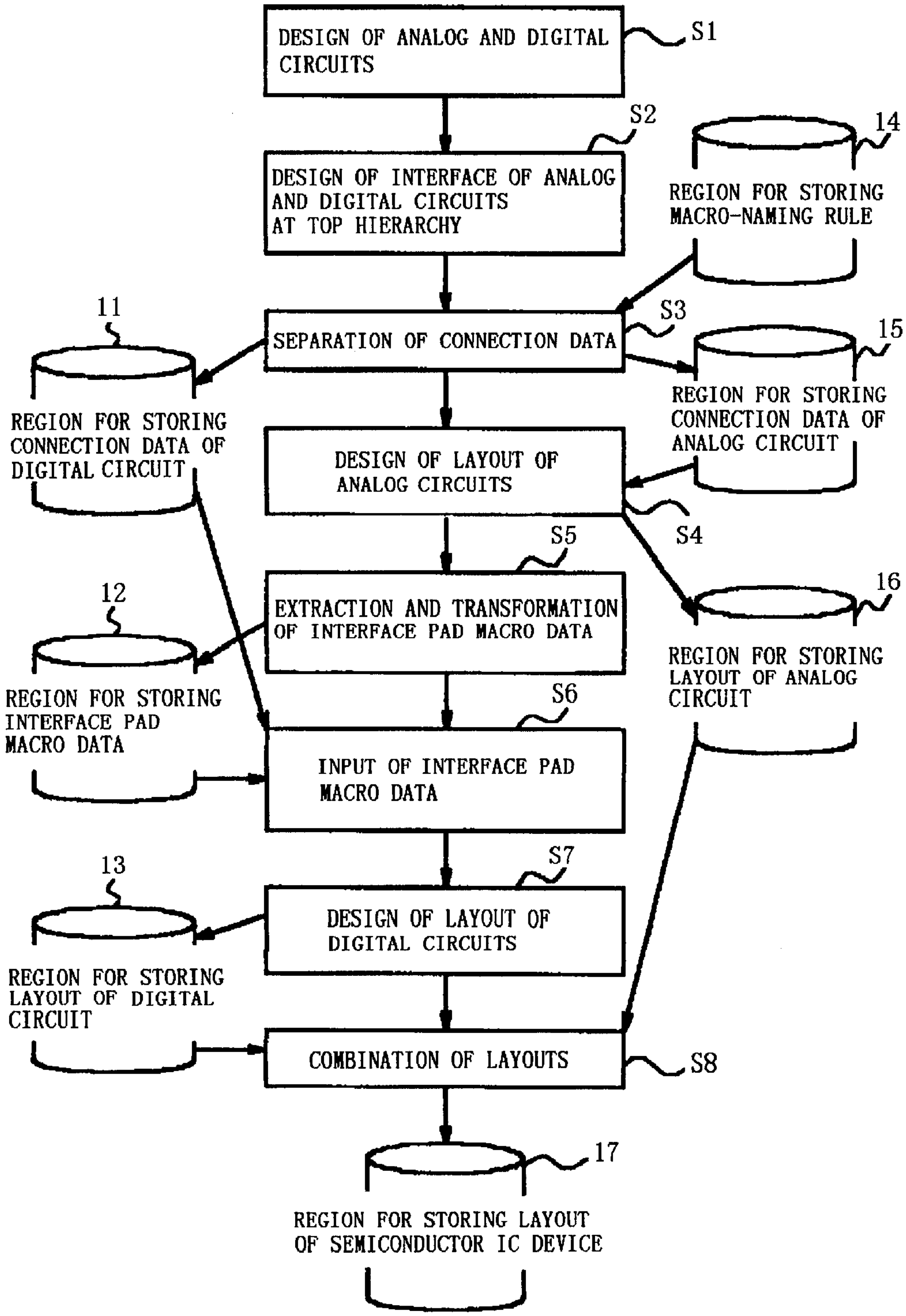
FIG. 6 is a flow chart of a method in accordance with the first embodiment of the present invention.

FIG. 6 is a flow chart of the method in accordance with the instant embodiment.

First, an analog circuit and a digital circuit both of a semiconductor integrated circuit device are separately designed in step 1.

Then, symbols of the analog and digital circuits are formed. An interface between the analog and digital circuits is designed by connecting the symbols to each other. Top hierarchy is thus designed. The connection data of the analog and digital circuits are combined mainly at the top hierarchy in step 2.

In step 3, the thus combined connection data is separated into connection data for the analog circuit and connection data for the digital circuit in accordance with the macro-naming rule stored in the region 14. The connection data for the analog circuit is stored in the region 15, and the connection data for the digital circuit is stored in the region 11.

Then, in step 4, a layout of the analog circuit is designed based on the connection data of the analog circuit, stored in the region 15. The thus designed layout of the analog circuit is stored in the region 16.

Then, in step 5, data about positioning of an interface pad in the analog circuit is transformed into data about positioning of an interface pad in the digital circuit. The thus transformed data about positioning of an interface pad in the digital circuit is stored in the region 12.

By inputting the data stored in the region 12, an interface pad macro for the digital circuit is automatically arranged in step 6. Other parts in the digital circuit are positioned, and wirings are made in step 7.

In step 8, a layout of a one-chip IC device including both analog and digital circuits is completed without designing a layout of an interface at top hierarchy, merely by combining the layouts of the analog and digital circuits, transmitted from the regions 16 and 13 in which the layouts of the analog and digital circuits, designed in the sections 25 and 27, respectively, are stored. The thus obtained layout of a one-chip IC device is stored in a region 17.

Figure 7:
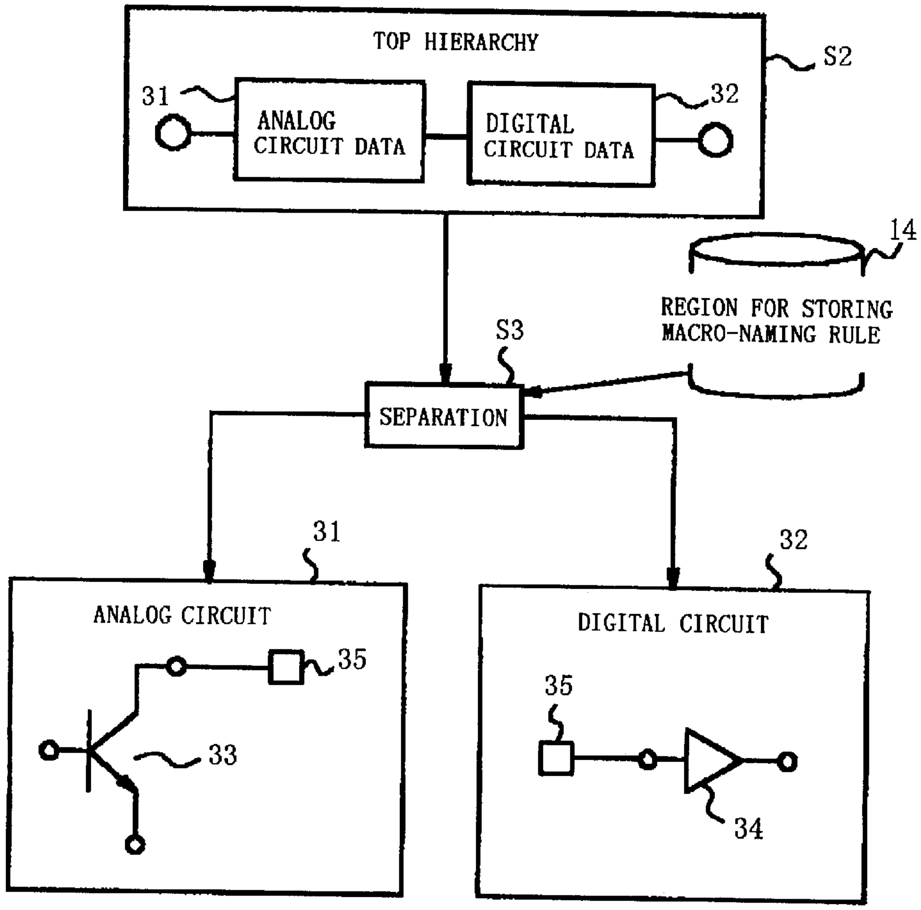
FIG. 7 is a flow chart of the step of separating connection data of top hierarchy into connection data of analog and digital circuits in accordance with macro-naming rule.

Hereinbelow is detailed the above-mentioned step 3 with reference to FIG. 7. As illustrated in FIG. 7, the step 3 is characterized by that the connection data obtained in the step 2 is separated into data for the analog circuit and data for the digital circuit in accordance with macro-naming rule stored in the region 14. Interface pads 35 are automatically established in separated nets, that is, in both an analog circuit 31 including an analog device 33 and a digital circuit 32 including a digital device 34. The thus established interface pads 35 are connected to each other. In addition, the thus established interface pads 35 are given the same instance name.

The interface pad macro established in step 3 where macro including both analog and digital is separated is different in kind from an interface pad macro to be established at a connection between the ordinary analog and digital devices 33 and 34 which are connected through an interface buffer. Judgement as to which kind an interface pad macro belongs to is carried out also in accordance with the macro-naming rule stored in the region 14.

Figure 8:
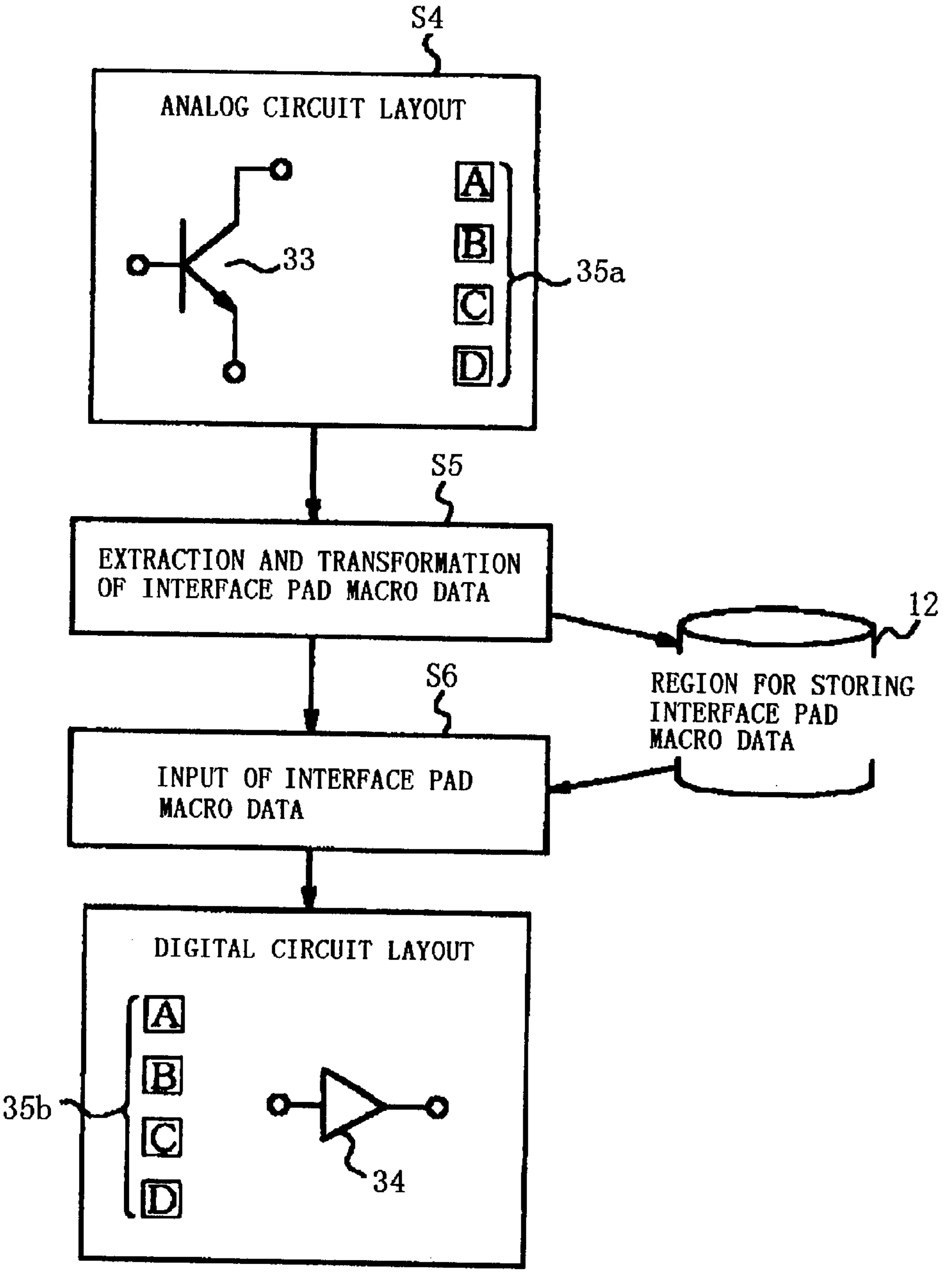
FIG. 8 is a flow chart of the step of extracting interface pad macro from an analog circuit, transforming the thus extracted interface pad macro to digital data, and inputting the thus transformed data into a digital circuit.

Hereinbelow is explained the above-mentioned step 5 in detail with reference to FIG. 8. As illustrated in FIG. 8, in step 5, data about positioning of an interface pad **35*a* of the analog circuit, established in step 4, is transformed into data about positioning of an interface pad 35*b*** of the digital circuit. An interface pad for a macro including both analog and digital circuits is different from an interface pad macro for other parts with respect to a format of data about positioning.

The interface pad for the other parts is connected to the analog circuit through an interface buffer like other external pads which are connected to an internal cell through I/O buffer. The data about positioning for the other parts is transformed in the same format as a format of the I/O buffer in order to position the interface buffer in the same manner as the I/O buffer. Since the interface pad for a macro including both analog and digital circuits does not need an interface buffer, it is transformed in an ordinary format of data about positioning of an internal cell.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-345046 filed on Dec. 25, 1996 including specification, claims, drawings and summary is incorporated herein by reference in its entirety.

What is claimed is:

1. An apparatus for positioning a semiconductor integrated circuit device comprising analog and digital circuits, on a semiconductor substrate, comprising:

(a) first means for designing said analog circuit;

(b) second means for designing said digital circuit;

(c) third means for designing a top hierarchy circuit;

(d) fourth means for separating and combining data about connection among circuits designed by said first, second and third means;

(e) fifth means for designing a layout of said analog circuit, based on data transmitted from said fourth means;

(f) sixth means for extracting analog data from said fifth means, and transforming said analog data to digital data based on interface data that defines interfaces between said analog circuit and said digital circuit transmitted from said fourth means;

(g) seventh means for designing a layout of said digital circuit, based on connection data of said digital circuit transmitted from said fourth means; and (h) eighth means for combining data about said layouts of said analog and digital circuits to each other to provide a one-chip layout.

2. The apparatus as set forth in claim 1, wherein said fourth means separates said data into connection data of said analog and digital circuits in accordance with macro-naming rule.

3. The apparatus as set forth in claim 1, wherein said fourth means establishes interface pad macros at connection points of said analog and digital circuits when said data is separated, and provides the same instance name to said interface pad macros.

4. A method of positioning a semiconductor integrated circuit device comprising analog and digital circuits, on a semiconductor substrate, comprising the steps of:

(a) designing a layout of said analog circuits that includes positioning of respective interface pads of said analog circuits;

(b) transforming first data designed in said step (a) about positioning of said interface pads to be connected to said digital circuits into second data about positioning of interface pads of said digital circuits;

(c) designing a layout of said digital circuit based on said second data; and (d) combining said layouts of said analog and digital circuits with each other to connect interfaces of said analog and digital circuits to each other.

5. The method as set forth in claim 4, wherein said first data includes a name of said interface pads and positional coordinate of said interface pads.

* * * * *